(12) United States Patent
Coppens et al.

(10) Patent No.: US 12,068,406 B2
(45) Date of Patent: Aug. 20, 2024

(54) HEMT DEVICES WITH REDUCED SIZE AND HIGH ALIGNMENT TOLERANCE

(71) Applicant: SEMICONDUCTOR COMPONENTS INDUSTRIES, LLC, Phoenix, AZ (US)

(72) Inventors: Peter Coppens, Kanegem (BE); Peter Moens, Erwetegem (BE); Joris Baele, Ghent (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 716 days.

(21) Appl. No.: 17/248,989

(22) Filed: Feb. 16, 2021

(65) Prior Publication Data

US 2022/0262940 A1 Aug. 18, 2022

(51) Int. Cl.
| | |
|---|---|
| H01L 29/778 | (2006.01) |
| H01L 29/10 | (2006.01) |
| H01L 29/40 | (2006.01) |
| H01L 29/66 | (2006.01) |
| H01L 29/20 | (2006.01) |

(52) U.S. Cl.
CPC ...... *H01L 29/7786* (2013.01); *H01L 29/1066* (2013.01); *H01L 29/402* (2013.01); *H01L 29/66462* (2013.01); *H01L 29/7787* (2013.01); *H01L 29/2003* (2013.01)

(58) Field of Classification Search
None
See application file for complete search history.

(56) References Cited

U.S. PATENT DOCUMENTS

| | | |
|---|---|---|
| 2004/0063303 A1 | 4/2004 | Behammer |
| 2004/0082158 A1 | 4/2004 | Whelan et al. |
| 2010/0258843 A1 | 10/2010 | Lidow et al. |
| 2012/0193688 A1* | 8/2012 | Lidow ............... H01L 29/42316 257/E21.409 |

(Continued)

FOREIGN PATENT DOCUMENTS

EP 3591691 A1 1/2020

OTHER PUBLICATIONS

ThoughtCo article on Table of Electrical resistivity and Conductivity available online as of Jun. 26, 2019 at https://www.thoughtco.com/table-of-electrical-resistivity-conductivity-608499 (Year: 2019).*

(Continued)

*Primary Examiner* — Grant S Withers
(74) *Attorney, Agent, or Firm* — Brake Hughes Bellermann LLP

(57) ABSTRACT

A High Electron Mobility Transistor (HEMT) includes a source, a drain, a channel layer extending between the source and the drain, a barrier layer formed in contact with the channel layer, and extending between the source and the drain, and a gate formed in contact with, and covering at least a portion of, the barrier layer. The gate has gate edge portions and a gate central portion, and dielectric spacers may be formed over the gate edge portions, with the dielectric spacers having a first width therebetween proximal to the gate, and a second width therebetween distal from the gate, where the second width is longer than the first width.

20 Claims, 15 Drawing Sheets

(56) References Cited

U.S. PATENT DOCUMENTS

2014/0091308 A1 4/2014 Dasgupta et al.
2019/0326404 A1* 10/2019 Kumazaki ......... H01L 29/66462

OTHER PUBLICATIONS

European Patent Office, extended European Search Report, Application No. 22156218.4-1212, Oct. 21, 2022.
European Patent Office, Partial Search Report, Application No. 22156218.4-1212, Jul. 18, 2022.

* cited by examiner

HEMT DEVICES WITH REDUCED SIZE AND HIGH ALIGNMENT TOLERANCE

TECHNICAL FIELD

This description relates to High Electron Mobility Transistors (HEMTs).

BACKGROUND

A HEMT is a type of transistor that utilizes a current channel formed using a heterojunction at a boundary between two materials having different band gaps. For example, a relatively wide band gap material such as AlGaN (Aluminum Gallium Nitride) may be doped with n-type impurities and used to form a junction with an undoped, relatively narrow band gap material, such as GaN (Gallium Nitride). Then, an equilibrium is reached in which the narrow band gap material has excess majority carriers that form a 2-dimensional electron gas (2DEG). Consequently, and because the narrow band gap material has no doping impurities to disrupt current flow through scattering, HEMT devices provide, among other advantages, very high switching speeds, high gains, and high power applications.

HEMTS often require advanced lithography to pattern dense layout rules in an attempt to maximize die area while still providing high-performing, reliable devices. Nonetheless, conventional processing techniques are limited in their ability to achieve these goals, and to do so in an efficient manner.

SUMMARY

According to one general aspect, a High Electron Mobility Transistor (HEMT) includes a source, a drain, a channel layer extending between the source and the drain, and a barrier layer formed in contact with the channel layer, and extending between the source and the drain. A gate may be formed in contact with, and covering at least a portion of, the barrier layer, and the gate may have gate edge portions and a gate central portion. Dielectric spacers may be formed over the gate edge portions, the dielectric spacers having a first width therebetween proximal to the gate, and a second width therebetween distal from the gate, with the second width being longer than the first width. A gate electrode may be formed on the gate central portion and between the dielectric spacers.

According to another general aspect, a High Electron Mobility Transistor (HEMT) device includes a source, a drain, and gate disposed between the source and the drain and formed on a barrier layer of the HEMT. The gate may have a first gate edge portion, a second gate edge portion, and a gate central portion. The HEMT may include a first dielectric spacer formed on the first gate edge portion, a second dielectric spacer formed on the second gate edge portion, and a gate electrode formed between the first dielectric spacer and the second dielectric spacer, and in contact with the gate at the gate central portion.

According to another general aspect, a method of making a High Electron Mobility Transistor (HEMT) may include forming a gate on a barrier layer of the HEMT. The method may include forming a first dielectric spacer and a second dielectric spacer on the gate, with a first width therebetween at a first distance from the gate and a second width therebetween at a second distance from the gate, wherein the second width is greater than the first width, and the second distance is greater than the first distance. The method may include forming a gate electrode on the gate and between the first dielectric spacer and the second dielectric spacer, forming a source contact to a source of the HEMT, and forming a drain contact to a drain of the HEMT.

The details of one or more implementations are set forth in the accompanying drawings and the description below. Other features will be apparent from the description and drawings, and from the claims.

DETAILED DESCRIPTION

As described in detail below, embodiments include a HEMT device structure in which lithography requirements are minimized, while providing small device features within high tolerance levels. For example, processing techniques may utilize dielectric structures (e.g., a dielectric spacer, plug, or foot, as described in detail below) to enable desired formation of device structures (e.g., a gate electrode, field plate, or source contact, as also described below), while minimizing a need for lithography during processing.

Described approaches enable other advantages, as well. For example, described HEMT device structures may be constructed at extremely small sizes, thereby enabling more efficient use of die area. Further, described techniques provide high alignment tolerance, so that misalignments are rare, and it is not necessary to account for or reserve extra die area to account for misalignments.

Additionally, it is possible to form a low-resistive gate electrode, which reduces a need for gate runners and, again, enables more efficient use of die area. For example, described techniques enable use of at least two metals when constructing a gate electrode, with one of the metals having a lower resistivity than the other(s).

Figure 1:
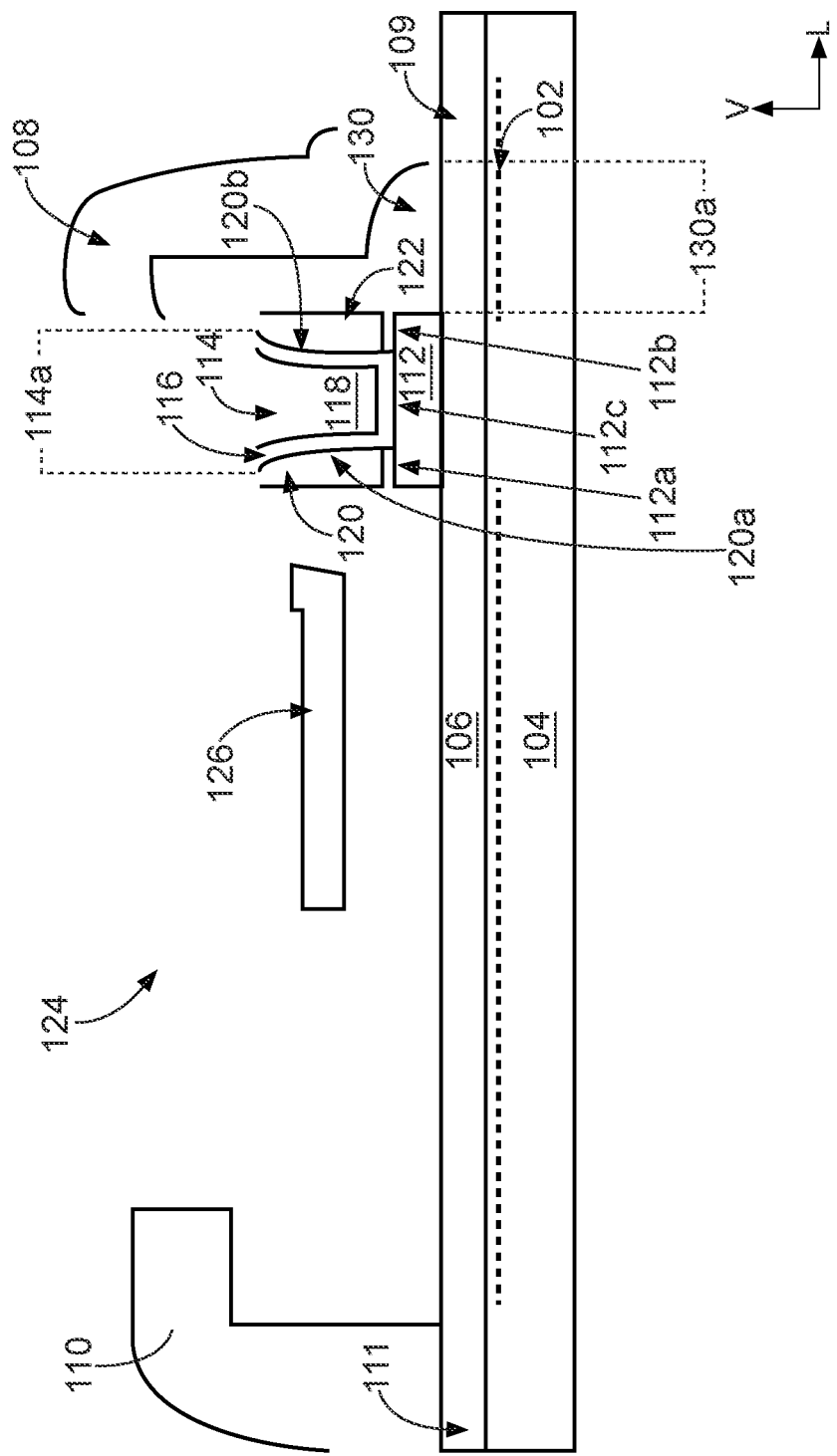
FIG. 1 illustrates a cross-section of a HEMT according to example embodiments.

FIG. 1 illustrates a cross-section of a HEMT according to example embodiments. FIG. 1 is provided for the sake of illustration and example of the various aspects described below, and is not necessarily drawn to scale. Additional example embodiments are provided in more detail below, e.g., with respect to FIGS. 2-16.

In FIG. 1, a channel layer 104 is formed in contact with a barrier layer 106, and forms a heterojunction with the barrier layer 106. The heterojunction occurring at the interface of the channel layer 104 and the barrier layer 106 causes a channel region 102 that includes a 2DEG region of high electron mobility. For example, the channel layer 104 may be an undoped material with a relatively large width and relatively narrow bandgap energy (such as, e.g., Gallium Nitride, or GaN), while the barrier layer 106 may be a doped material with a relatively thin width and a relatively wide bandgap energy (such as, e.g., Aluminum Gallium Nitride, or AlGaN).

Further in FIG. 1, a source contact 108 and source region 109 of the HEMT are illustrated, along with a drain contact 110 and drain region 111 of the HEMT. During operation of the HEMT, current flows between the source region 109 and the drain region 111, by way of the channel region 102.

In general, due to the presence of the 2DEG referenced above, it is straightforward to form a 'normally-on' or depletion mode HEMT, in which source/drain current flows as a default state of the device. However, a 'normally-off' or enhancement mode HEMT may be desired, in which the source/drain current is prohibited as a default state. In general, normally-off HEMTs may have an improved safety profile, and may simplify related drive circuitry, among other advantages.

In FIG. 1, the HEMT is maintained in a normally-off state through the use of a gate 112. That is, the HEMT of FIG. 1 may represent a normally-off device that prevents current flow through the channel region 102, unless the gate 112 is activated/biased.

For example, the gate 112 may be implemented as a p-type layer of GaN, also referred to as pGaN, which has an interface with, and at least partially covers, the barrier layer 106. For example, the pGaN layer 112 may be doped with Magnesium. The pGaN layer 112, barrier layer 106, and channel layer 104 may be understood to form a PIN (p-type, intrinsic, n-type) diode structure with a depletion zone that extends over the channel layer 104. This depletion zone disrupts the 2DEG of the channel region 102 in a default or unbiased state (e.g., $V_{gs}$=0V), but is rapidly removed by application of a positive bias at the gate 112, which thereby allows source-drain current to flow.

In the example embodiment of FIG. 1, a gate electrode 114 is illustrated, which may be used in applying a positive bias to the gate 112, as just referenced, and as described in further detail, below. As illustrated, the gate electrode 114 includes a first gate electrode metal 116 and a second gate electrode metal 118.

A dielectric spacer 120 and a dielectric spacer 122 are disposed over the gate 112. More particularly, the dielectric spacer 120 is disposed over a first gate edge portion 112a, while the dielectric spacer 122 is disposed over a second gate edge portion 112b.

The gate electrode 114 contacts the gate 112 at a gate central portion 112c (disposed laterally between the first gate edge portion 112a and the second gate edge portion 112b). The gate electrode metal 116 has a shape defined by conformance to a shape of the dielectric spacer 120, and to a shape of the dielectric spacer 122. Specifically, in the example of FIG. 1, the dielectric spacer 120 has a surface 120a with a curved shape, to which a corresponding surface of the gate electrode metal 116 conforms. Similarly, the dielectric spacer 122 has a surface 122a, facing the surface 120a, and having a curved shape. A corresponding surface of the gate electrode metal 116 conforms to the surface 122a.

For example, the surfaces 120a, 122a may be convex (rounded outward) with respect to a concave (rounded inward) surface(s) of the gate electrode metal 116. In other examples, conversely, the surfaces 120a, 122a may be concave with respect to a convex surface(s) of the gate electrode metal 116. Other shapes of the dielectric spacers 120, 122 also may be used, resulting in corresponding inverse shapes of the gate electrode metal 116.

The gate electrode metal 118 is disposed within a space defined by the gate electrode metal 116. Consequently, the gate electrode metal 118 may be referred to as an interior gate electrode metal 118, while the gate electrode metal 116 may be referred to as an exterior gate electrode metal 116.

Thus, in FIG. 1, the dielectric spacers 120, 122 are formed over the gate edge portions 112a, 112b, respectively. As shown, the dielectric spacers 120, 122 have at least a first width therebetween proximal to the gate 112. For example, the first width may be defined along a lateral direction L at a first distance from the gate 112 along a vertical direction V that extends from the gate 112 and away from the barrier layer 106. For example, the first width may be defined by, or the same as, a length of the gate central portion 112c, which width may also correspond to a width of the gate electrode 114 at an interface of the gate electrode 114 and the gate 112 (e.g., at the gate central portion 112c).

The dielectric spacers 120, 122 have a second width therebetween (e.g., laterally), distal from the gate 112 (e.g., at a second position in the vertical direction V), the second width being longer than the first width. For example, a width 114a between outer edges of the gate electrode 114 may be longer than the distance (width) 112c.

In examples in which the surfaces of the dielectric spacers 120, 122 are curved (e.g., increasingly curved), and in other possible examples, the widths therebetween may increase directly, continuously, and/or monotonically with increased distance in the vertical direction V. For example, as visible in FIG. 1, at an intermediate (e.g., third) vertical distance from the gate 112, a corresponding width between the dielectric spacers 120, 122 may be intermediate to (in between) the widths 112c, 114a (e.g., more than 112c, but less than 114a).

As described in detail below, the interior gate electrode metal 118 may have a lower resistivity than the exterior gate electrode metal 116. Using the lower resistivity material, and having a corresponding low resistive gate connection, may enable the gate electrode 114 as a whole to be very narrow, without sacrificing performance of the HEMT of FIG. 1. The resulting gate structure requires fewer gate runners, which further reduces an overall die footprint of a device structure using the HEMT of FIG. 1.

Thus, by shaping the dielectric spacers 120, 122 in a desired fashion, the gate electrode metals 116, 118 may be formed in a complementary fashion thereto, and to one another. For example, the gate electrode metal 118 may also have proximal and distal width variations with respect to the gate 112, similar to such width variations described above for the gate electrode metal 116. Also, although curved implementations are illustrated and described, other implementations may be used, as well, such as tapered, narrowing, or other variations in the vertical direction V.

In FIG. 1, dielectric 124 represents one or more layers of one or more types of dielectric materials, various examples of which are illustrated and described, below. As illustrated in FIG. 1, the dielectric 124 extends between the drain contact 110 and the source contact 108, and surrounds the gate 112, dielectric spacers 120, 122, and the gate electrode 114.

The dielectric 124 further encloses a field plate 126. Field plates are used in HEMT devices, for example, to provide a capacitance that enhances a breakdown voltage of the HEMT device. In FIG. 1, a distance 128 is defined by a portion of the dielectric 124 between the dielectric spacer 120 and the field plate 126. By using the relevant portion of the dielectric 124 to define the distance 128, lithography may be minimized in forming the HEMT of FIG. 1, while obtaining a desired length of the distance 128 with a small but achievable alignment tolerance.

Also in FIG. 1, the dielectric 124 includes a foot 130 that is a distance 130a from the gate 112. By maintaining the distance 130a, the source contact 108 at the barrier layer 106 may be maintained a desired distance from the gate 112.

Thus, in the structure of FIG. 1, and related structures such as those described below, it is possible to form a very narrow gate 112, e.g., half a micron or less, with a gate electrode 114 that is even more narrow. An alignment tolerance may be kept small, e.g., less than 0.1 micron, while an overall pitch of the device (from mid-source to mid-drain) may be kept, e.g., to under 5 microns, as well (e.g., 4-5 microns). Moreover, these and other advantages may be obtained with little or no need for advanced alignment capabilities and associated resources.

Figure 2:
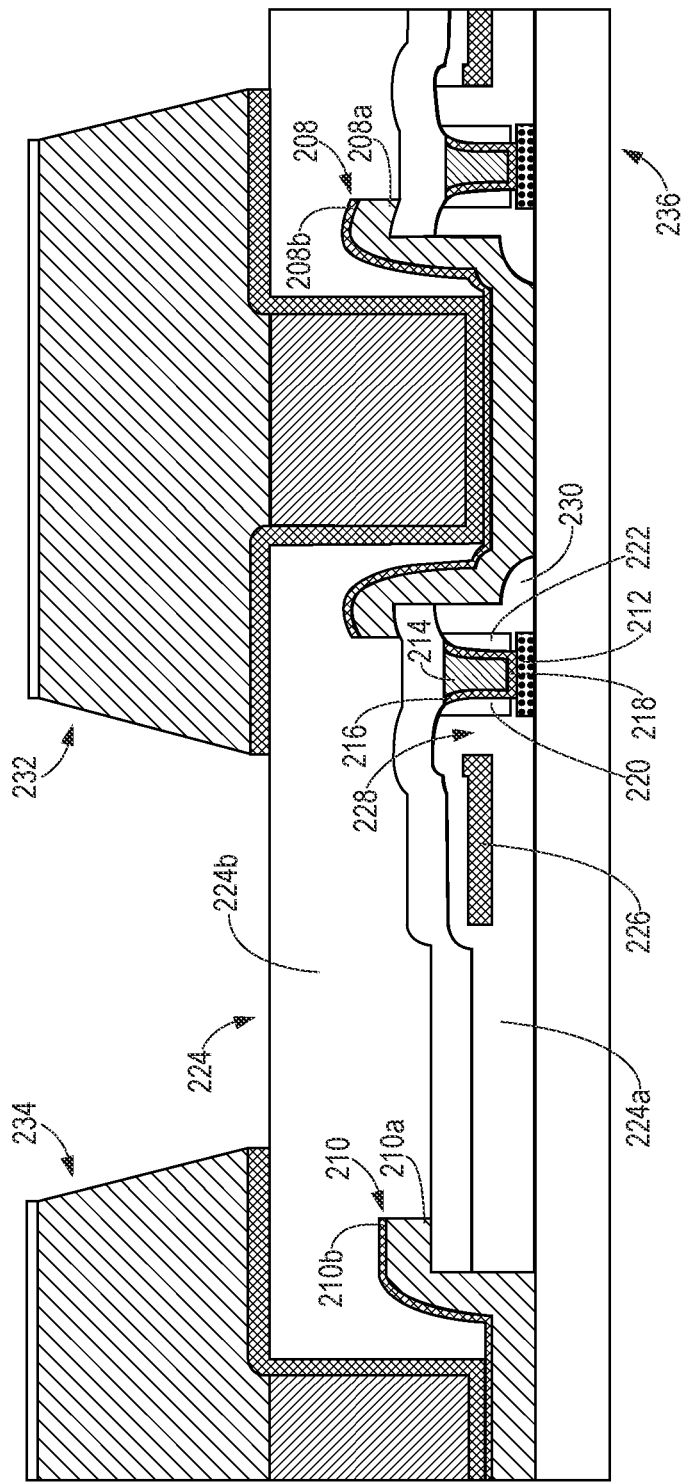
FIG. 2 is a more specific example of the HEMT of FIG. 1.

FIG. 2 is a more specific example of the HEMT of FIG. 1. In FIG. 2, the channel 102, the channel layer 104, the barrier layer 106, the source region 109, and the drain region 111 are not illustrated in detail. Also in FIG. 2, reference numerals are numbered consistently with the example of FIG. 1, but as a 2xx number series.

For example, FIG. 2 illustrates a source contact 208, drain contact 210, and gate 212. The gate electrode 214, which includes an exterior gate electrode metal 216 and an interior gate electrode metal 218, is disposed within and between dielectric spacers 220, 222. Further, a field plate 226 is disposed a distance 228 away from the gate electrode 214, and a foot 230 characterizes a distance between the gate 212 and the source contact 208 that corresponds to the distance 130a of FIG. 1.

FIG. 2 illustrates various other example details that may be used in constructing the HEMT of FIG. 1, many of which are described in detail below, but which are included here merely for the sake of example and illustration. For example, the source contact 208 may include a first metal 208a and a second metal 208b, while similarly, the drain contact 210 may include a first metal 210a and a second metal 210b. The source contact 208 and the drain contact 210 may be electrically connected to metallization 232 and metallization 234, respectively.

Additionally, the source contact 208 and metallization 232 may be common to a second gate structure 236. The second gate structure 236 is not described in detail herein, but is substantially similar to the described structures of FIGS. 1 and 2.

In FIG. 2, the dielectric 224 (corresponding generally to the dielectric 124 of FIG. 1) is illustrated as including multiple layers of multiple dielectric materials. For example, illustrated lower layer(s) 224a that are closer to the barrier layer may be formed using various types of silicon nitride, while upper layers formed thereon may be formed using various types of silicon oxide. More specific examples are provided, below.

FIGS. 3-16 illustrate example operations for forming the HEMT of FIG. 2. Beginning in FIG. 3, a barrier layer 306 of AlGaN is illustrated on a substrate 337 that may include a channel layer and other potential material layers used in HEMT devices.

For example, the substrate 334 may include, e.g., GaN, Si, Silicon Carbide (SiC), Aluminum Nitride (AlN), or Sapphire (e.g., monocrystalline $Al_2O_3$). In other examples, a strain relief layer may be included, if needed to facilitate strain relief with respect to any lattice mismatch that may occur.

Figure 3:
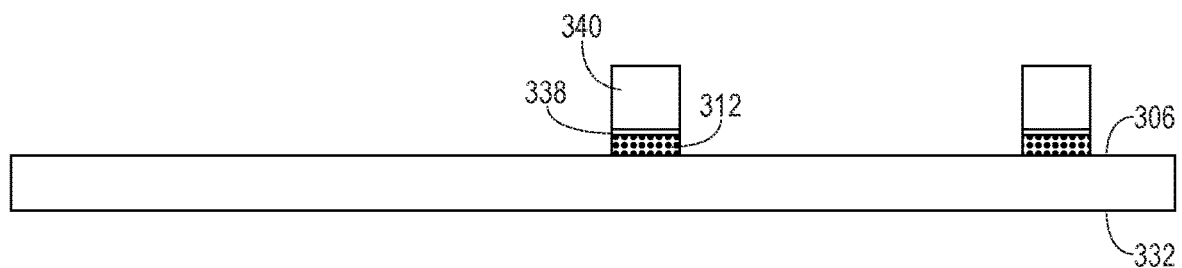
FIGS. 3-16 illustrate example operations for forming the HEMT of FIG. 2.

In FIG. 3, pGan 312, SiN layer (e.g., using $Si_3N_4$) 338, and oxide layer (e.g., $SiO_2$) 340 may be obtained by patterning and etching layers of those materials previously formed on the barrier layer 306. As referenced above, and described in detail, below, the oxide layer 340 may be referred to as a dielectric plug, which will enable formation of the dielectric spacers 220, 222.

Figure 4:
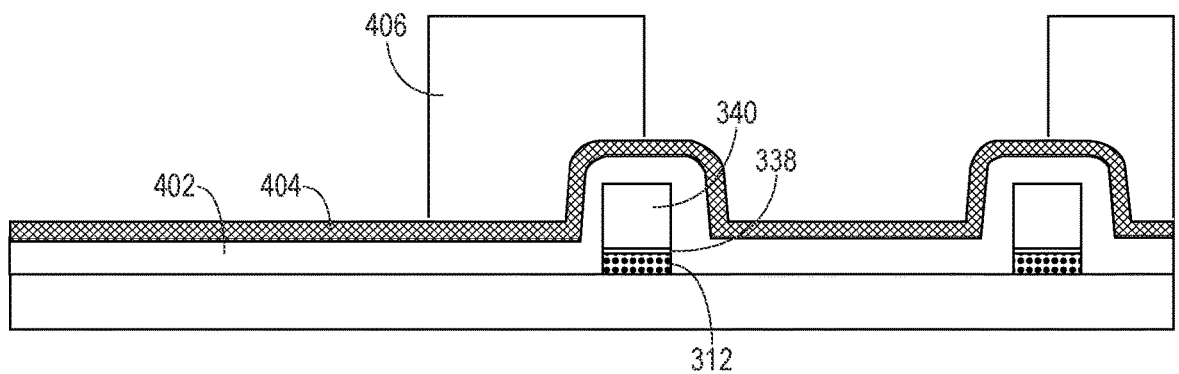

In FIG. 4 a SiN layer 402 is formed, e.g., through deposition, and a metal layer 404 is formed thereon. For example, a layer of TiN may be sputtered onto the SiN layer 402.

Then, a resist 406 may be patterned onto the metal layer 402. As shown, the resist may be formed partially over the gate 312 and partially adjacent to the gate 312. For example, the resist 406 may be formed with one side disposed over a gate central portion (corresponding to gate central portion 112c in FIG. 1) and with an opposed side that is a predetermined distance away from the gate central portion.

Figure 5:
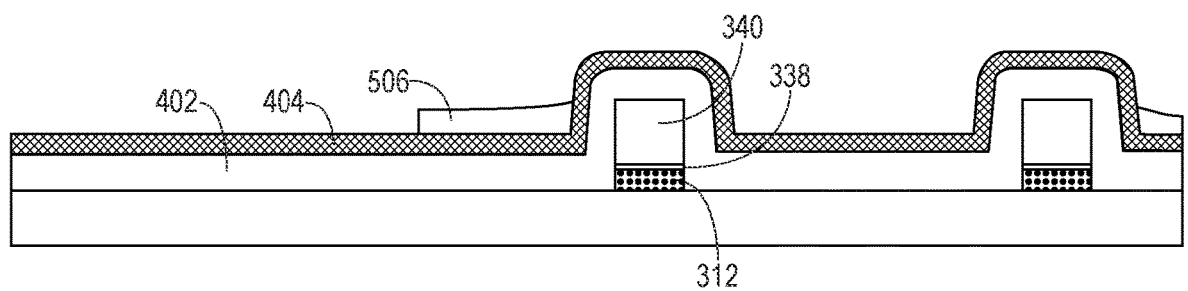
Figure 6:
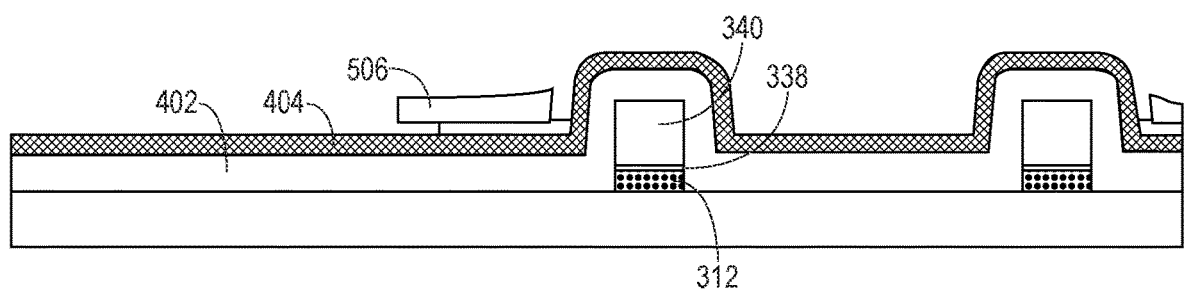

Then, in FIG. 5, a partial resist etchback is performed to leave remaining resist portion 506. In FIG. 6, the metal layer 404 is etched to leave field plate 626. For example, an isotropic etch, e.g., using sulfur hexafluoride ($SF_6$) may be performed. Then, the resist portion 506 may be removed.

In an alternative example to the preceding, the field plate 626 may be obtained by providing the TiN layer 404 followed by $SiO_2$ deposition, resist patterning, and resist etchback, where the $SiO_2$ may be etched using buffered hydrofluoric (BHF) etching. In these examples, following a resist strip to for resist removal, a wet TiN etch selective towards oxide and nitride may be performed, followed by a wet oxide etch to remove remaining silicon oxide.

Figure 7:
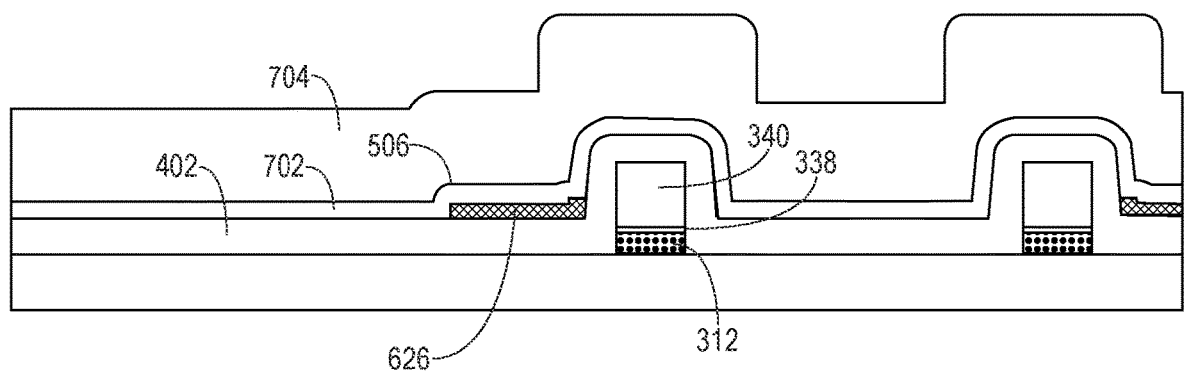
Figure 8:
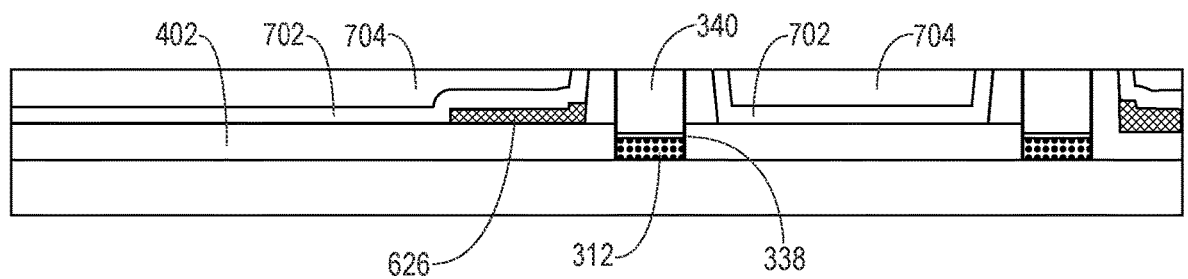

In FIG. 7, a SiN layer 702 is added, followed by formation of a oxide (e.g., $SiO_2$) layer 704. In FIG. 8, polishing (e.g., chemical mechanical polishing, or CMP) may be performed to remove top portions of layers 402, 702, and 704, and thereby access the dielectric plug 340.

Figure 9:
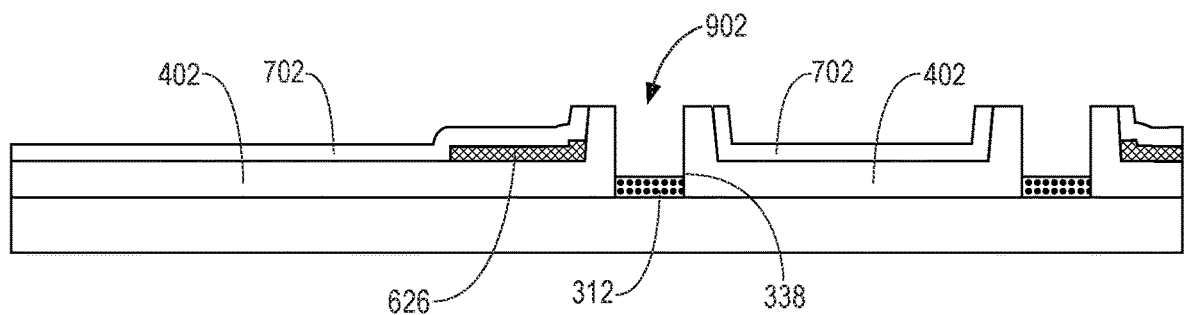

In FIG. 9, the dielectric plug 340, as well as remaining portions of the oxide layer 704, may be removed using, e.g., a wet oxide etch. As a result, an opening 902 is defined above the gate 312 and the SiN layer 338, and defined by sidewalls of remaining portions of the silicon nitride layer 402, as shown.

Figure 10:
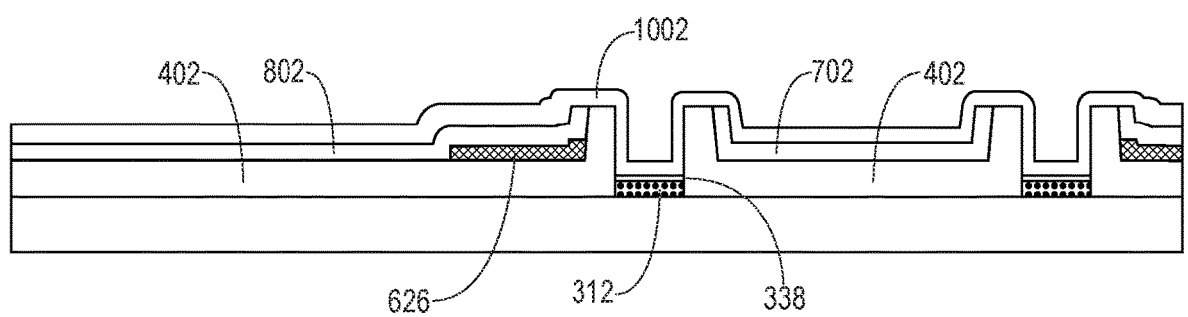
Figure 11:
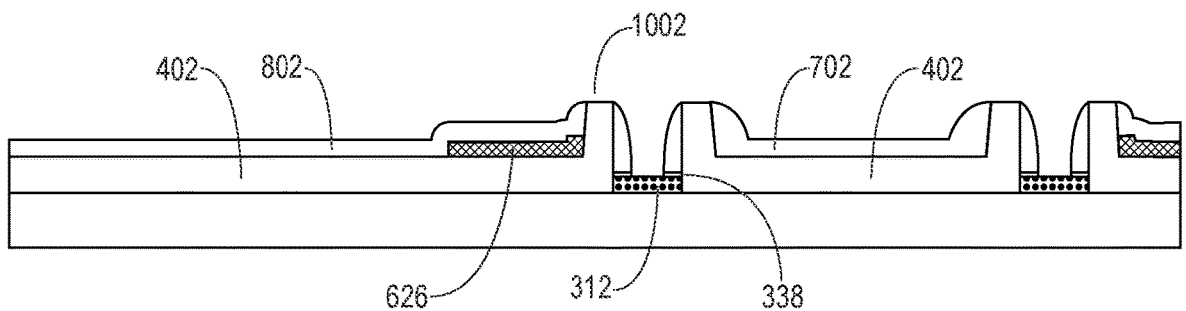

In FIG. 10, a silicon nitride layer 1002 is formed over the layer 802, adjacent to the above-referenced sidewalls of the layer 402, and over the silicon nitride layer 338 on the gate 312. Then, in FIG. 11, an etchback is performed to leave dielectric spacers 1120, 1122, which correspond to the dielectric spacers 220, 222 of FIG. 2.

Figure 12:
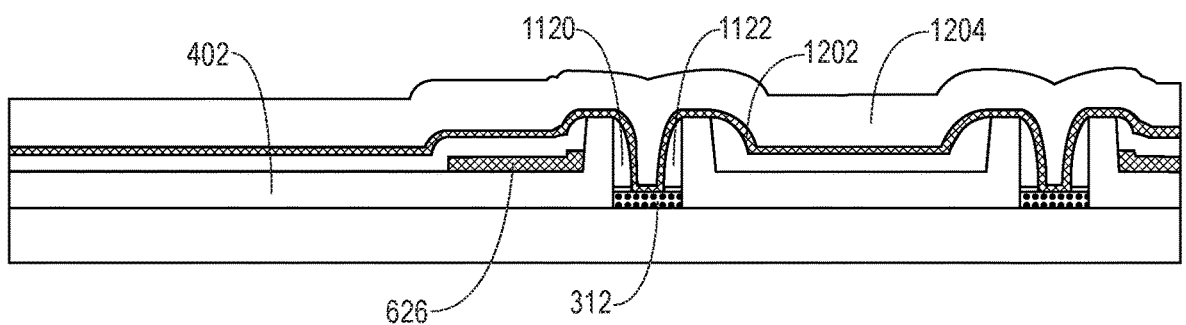

In FIG. 12, one or more metal layers may be added to form a gate electrode, such as metal layer 1202 and metal layer 1204. For example, TiN and W may be provided. As described above, a low-resistive metal such as Aluminum (Al) may be used.

FIGS. 13-16 illustrate remaining operations to form the HEMT device of FIG. 2, including techniques for retaining a portion of the layer 402 adjacent to one or more gate structures (e.g., between two adjacent gate structures) to provide the foot 230 of FIG. 2.

Figure 13:
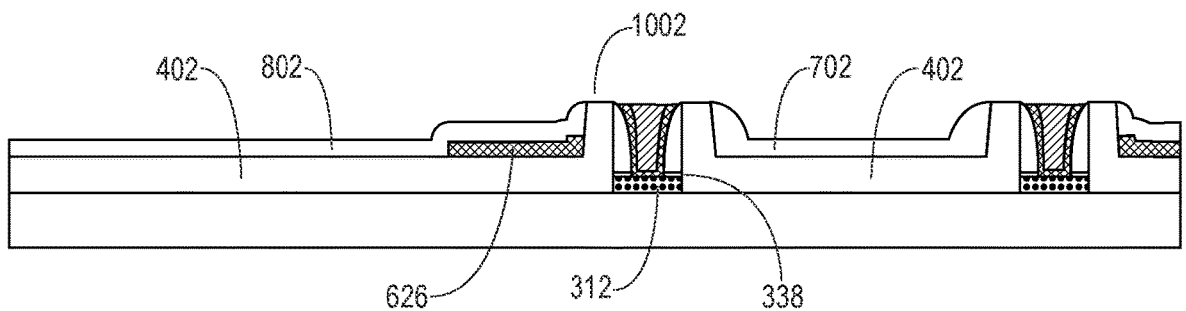

As shown in FIG. 13, the metal layers 1202, 1204 have been etched back to obtain gate electrode 1314, including an exterior gate electrode 1316 and an interior gate electrode 1318. In some implementations, the etchback may be performed with a mask, so as to retain portions of the metal layers 1202, 1204 in the third dimension, which may be used to connect multiple gates.

Figure 14:
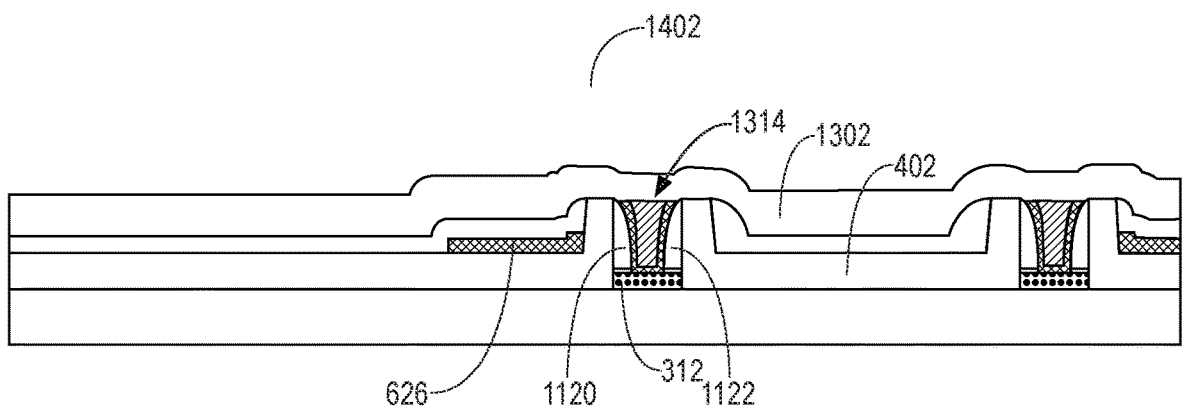
Figure 15:
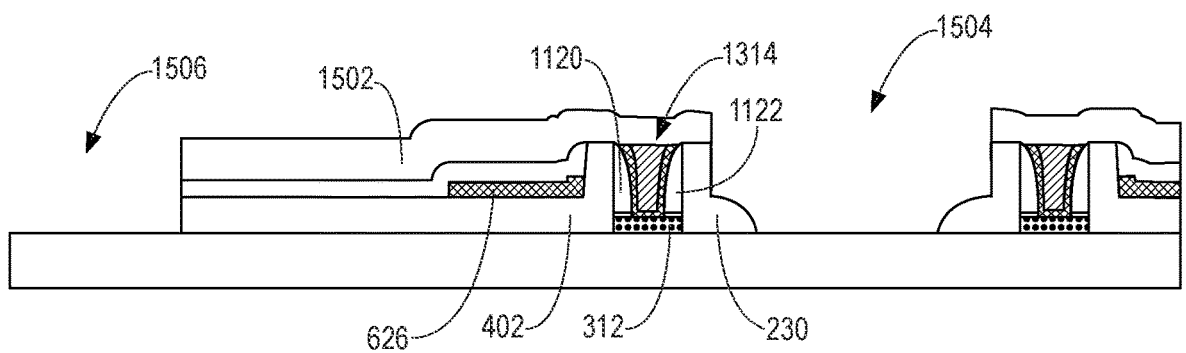
Figure 16:
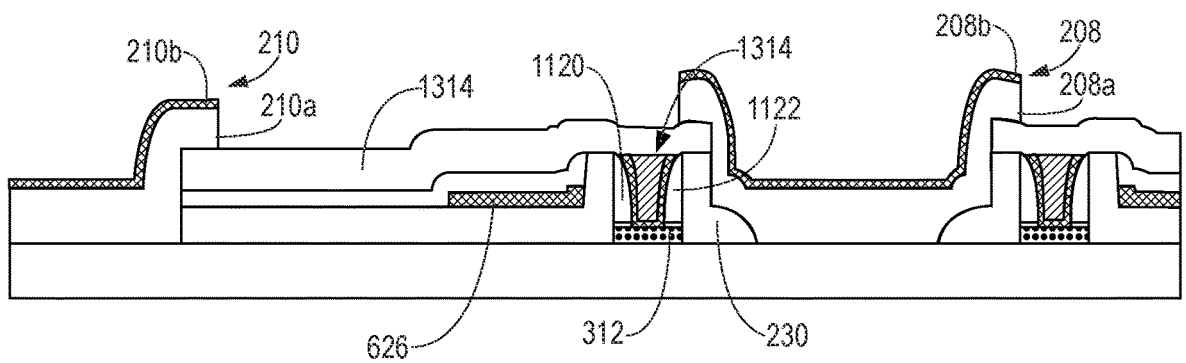

A silicon oxide layer 1302 is formed, and, in FIG. 14, an Ohmic contact resist 1402 is formed on portions of the silicon oxide layer 1302. In FIG. 15, the Ohmic contact resist 1402 is used to etch exposed dielectric layers, including the silicon nitride layer 402 adjacent to the gate 312 and the gate electrode 1314.

Due to the presence of the various dielectric layers, including the silicon oxide layer 1302, the foot 230 is retained during the etching process. Consequently, the source contact 208 and the drain contact 210 of FIG. 2 may easily be formed (e.g. through deposition, patterning, and anneal of the contact metal layers), while retaining the distance 130a of FIG. 1 between the gate 312 (or 212 in FIG. 2) and the source contact 208, at the surface of the barrier layer, as already described.

Then, the device of FIG. 2 may be completed. For example, additional silicon oxide may be added, through which vias may provide access to a first metal layer (metal 1) used to form the metallizations 232, 234.

FIGS. 3-16 illustrate an example process flow, but the HEMT devices of FIGS. 1 and 2, and similar devices, may be formed using additional or alternative techniques. For example, although specific types of dielectrics are mentioned above, other example implementations may use different types of dielectrics.

Figure 17:
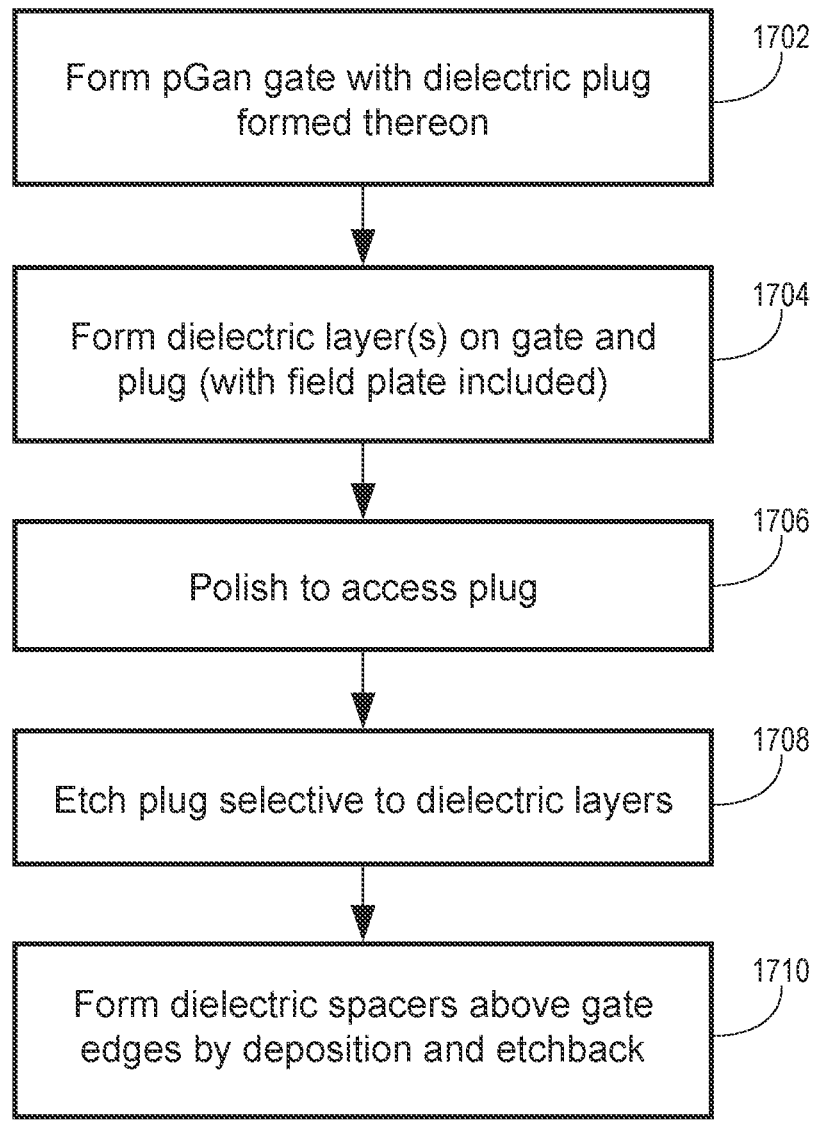
FIG. 17 is a flowchart illustrating example operations for forming a gate electrode of the HEMT of FIGS. 1 and 2.

FIG. 17 is a flowchart illustrating example operations for forming a gate electrode of the HEMT of FIGS. 1 and 2. In FIG. 17, a pGan gate is formed with a dielectric plug formed thereon (1702). Dielectric layers are formed on the gate and dielectric plug (1704). As described above, and below with respect to FIG. 18, a field plate may be included.

Polishing may be performed to access the plug (1706), and then the plug may be etched to provide an opening above the gate, the opening having dielectric sidewalls. As referenced above, multiple types of dielectrics may be used, but for purposes of the referenced etching, the combination of dielectrics may be selected to enable highly-selective etching of the plug with respect to the dielectric layers.

Dielectric spacers may then be formed through deposition and etchback of additional dielectric within the opening and on the dielectric sidewalls (1710). Accordingly, as described and illustrated above, it is straightforward to deposit and etch desired gate electrode metals, including a low-resistive gate metal.

Figure 18:
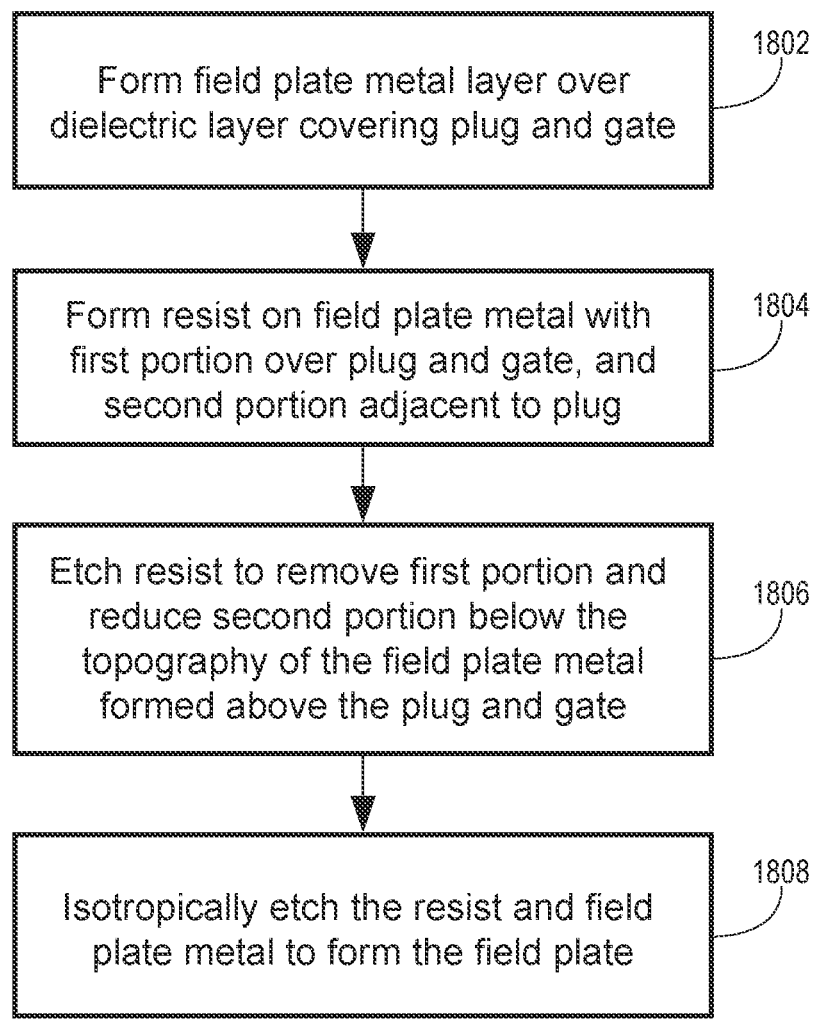
FIG. 18 is a flowchart illustrating example operations for forming a field plate of the HEMT of FIGS. 1 and 2.

FIG. 18 is a flowchart illustrating example operations for forming a field plate of the HEMT of FIGS. 1 and 2. In FIG. 18, a field plate metal layer is formed over a dielectric layer covering the dielectric plug and gate (1802). A resist may be formed on the field plate metal with a first resist portion formed over the plug and gate, and a second resist portion adjacent to the plug (1804).

The resist may be etched to remove the first resist portion, and to reduce the second resist portion below the topography of the field plate metal that was formed above the plug and gate (1806). Then, isotropic etching may be conducted to etch the field plate metal and thereby form the field plate (1808).

Figure 19:
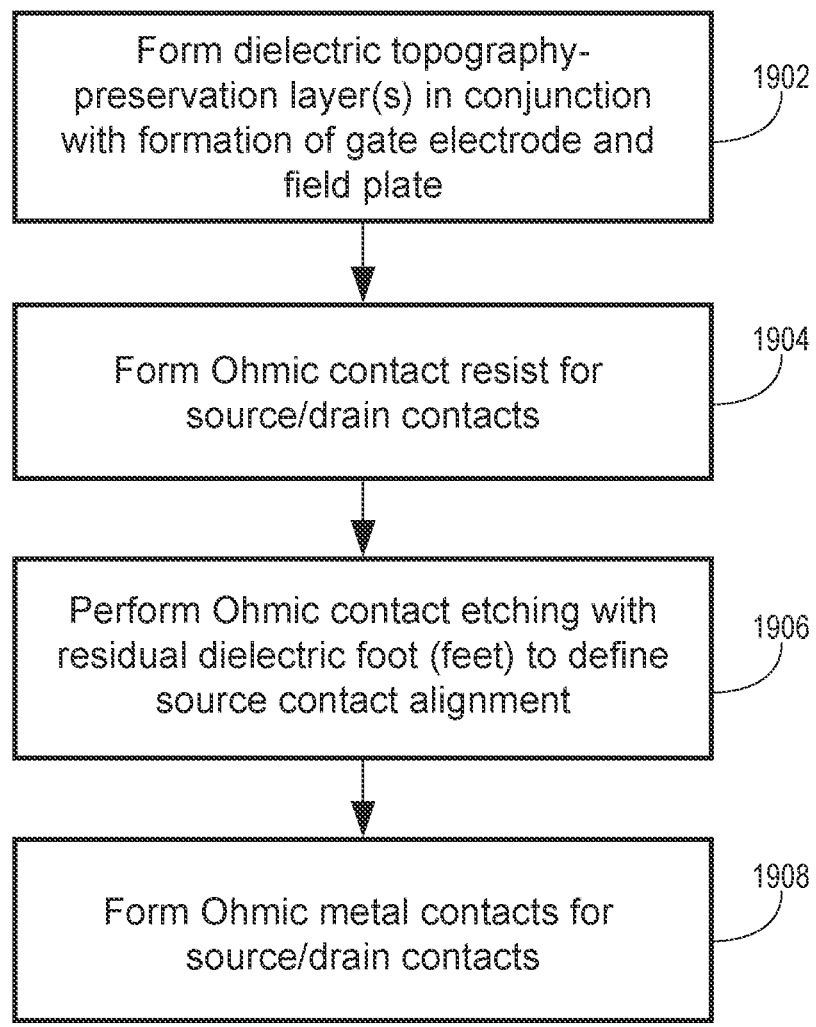
FIG. 19 is a flowchart illustrating example operations for forming a source contact of the HEMT of FIGS. 1 and 2.

FIG. 19 is a flowchart illustrating example operations for forming a source contact of the HEMT of FIGS. 1 and 2. In FIG. 19, topography-preservation dielectric layers are formed in conjunction with formation of the gate electrode (1902). For example, as shown in FIGS. 13-15, the various dielectric layers above the barrier layer between the adjacent gate structures, including the silicon oxide layer 1302, are formed so that the etching process of FIG. 15 may be conducted to retain the foot 230 (and corresponding foot at the adjacent gate structure).

Specifically, following formation of an Ohmic contact resist for the source/drain contacts (1904), Ohmic contact etching may be performed to obtain the dielectric foot (feet) that will define the source contact alignment with the gate, at the barrier layer. Thus, the Ohmic metal contacts may be formed for the source/drain contacts (1908), with associated deposition, etching, and annealing.

Figure 20:
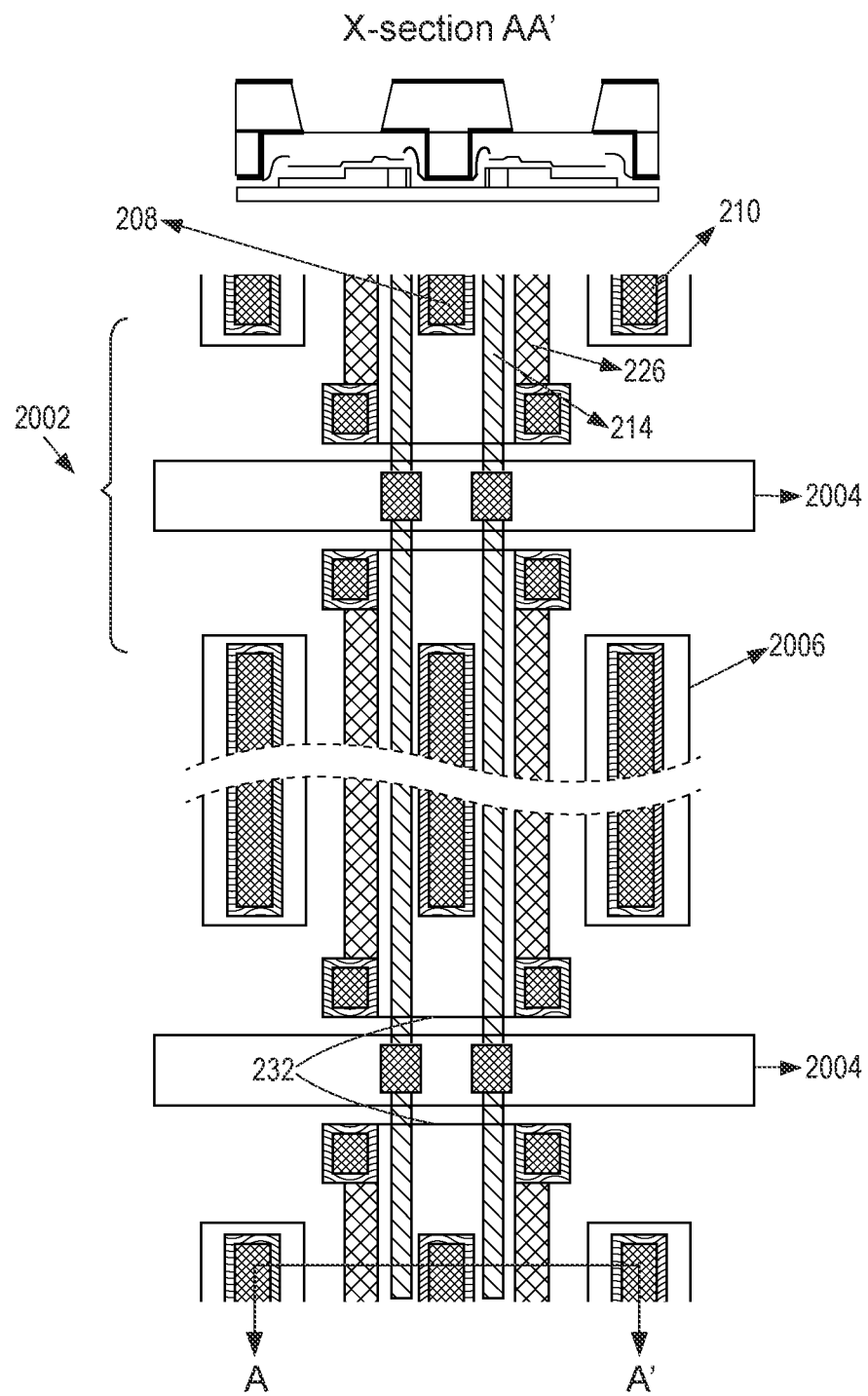
FIG. 20 is an example top view of the HEMT of FIG. 2.

FIG. 20 is an example top view of the HEMT of FIG. 2, taken along a line AA'. In FIG. 20, like elements are numbered with like reference numerals as in FIG. 2, including the source contact 208, the drain contact 210, the source metallization 232, and the drain metallization 234, as well as the gate electrode 214 and the field plate 226. In FIG. 20, the field plate 226 is visible as running parallel to the gate 212.

Further in FIG. 20, an active area 2002 of the HEMT device structure may be formed using a suitable isolation technique, such as implant isolation, or mesa isolation. As referenced above, lower gate resistance of the gate electrode 214 imparts an ability to make the active area 2002 larger than in comparable, conventional devices, and relative to an overall die size available for formation of the HEMT device.

A gate runner 2004 connects the various gate electrodes and gates together. Again, described techniques enable use of fewer gate runners 2004 as compared to conventional devices, which again increases an ability to make more efficient use of die area (e.g., include a higher density of HEMT devices).

Figure 21:
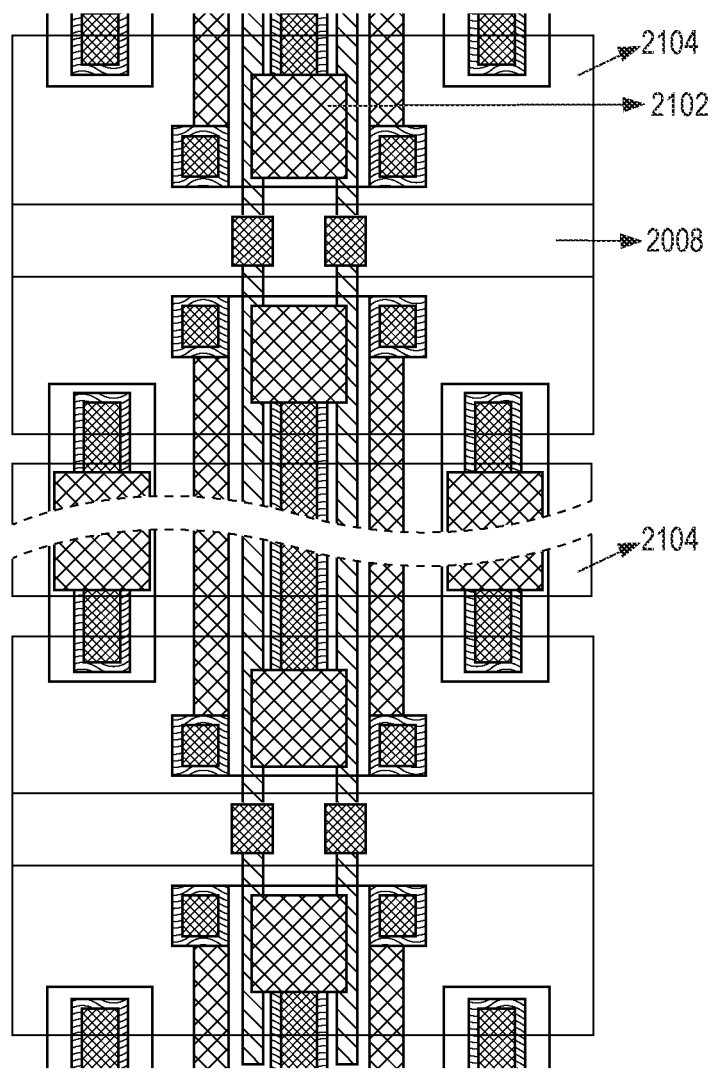
FIG. 21 is an example top view of the HEMT of FIG. 2 illustrating an additional metal layer.

FIG. 21 is an example top view of the HEMT of FIG. 2 illustrating an additional metal layer. In FIG. 21, a via 2102 enables connection to a source bus 2104 formed using the additional metal layer. The additional metal layer may also be used to form a drain bus 2104.

Figure 22:
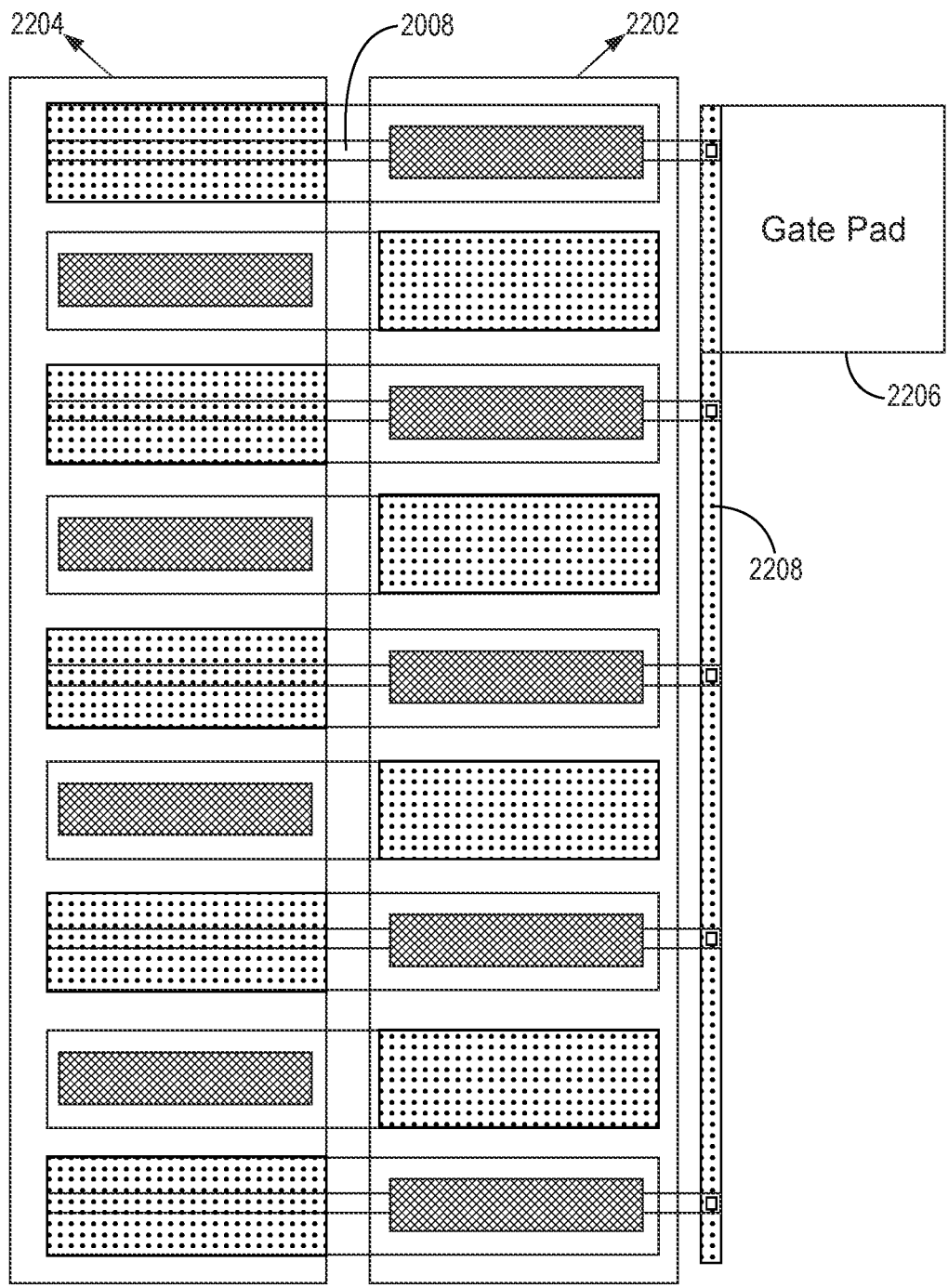
FIG. 22 is an example top view of the HEMT of FIG. 2 illustrating gate, source, and drain pads.

FIG. 22 is an example top view of the HEMT of FIG. 2 illustrating gate, source, and drain pads. FIG. 22 illustrates a source pad 2202 and a drain pad 2204. A gate pad 2206 is connected by common gate connection 2208 to the various gate runners 2008.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A High Electron Mobility Transistor (HEMT), comprising:
   a source;
   a drain;
   a channel layer extending between the source and the drain;
   a barrier layer formed in contact with the channel layer, and extending between the source and the drain;
   a p-type gate formed in contact with, and covering at least a portion of, the barrier layer, the gate having gate edge portions and a gate central portion;
   dielectric spacers formed over the gate edge portions, the dielectric spacers having a first total width therebetween at a first distance from the gate, and a second total width therebetween at a second distance from the gate, the second total width being longer than the first total width and the second distance being longer than the first distance; and
   a gate electrode formed on the gate central portion and between the dielectric spacers.

2. The HEMT of claim 1, wherein the dielectric spacers have curved surfaces, to which corresponding curved surfaces of the gate electrode conform.

3. The HEMT of claim 1, wherein the dielectric spacers have widths therebetween that increase with increasing distance from the gate, including at least a third width that is more than the first total width but less than the second total width.

4. The HEMT of claim 1, wherein the gate electrode comprises:
   a first metal layer formed in contact with the gate central portion, a first dielectric spacer of the dielectric spacers, and a second dielectric spacer of the dielectric spacers; and
   a second metal layer formed in contact with the first metal layer.

5. The HEMT of claim 4, wherein the second metal layer has a lower resistivity than the first metal layer.

6. The HEMT of claim 1, further comprising:
   at least one dielectric layer formed on the barrier layer, adjacent to a dielectric spacer of the dielectric spacers and to the gate, and between the gate and a source contact of the source; and
   a dielectric foot formed on the barrier layer and extending from the at least one dielectric layer in a direction of the source contact.

7. The HEMT of claim 6, wherein the source contact is formed over the dielectric foot and adjacent to the at least one dielectric layer.

8. The HEMT of claim 1, further comprising:
   a field plate connected to a source contact of the source and extending parallel to the gate, at a distance from a first dielectric spacer of the dielectric spacers that is defined by at least one intervening dielectric layer.

9. The HEMT of claim 8, wherein the field plate runs parallel to the gate between the gate electrode and a drain contact of the drain.

10. A High Electron Mobility Transistor (HEMT) device, comprising:
    a source;
    a drain;
    a p-type gate disposed between the source and the drain and formed on a barrier layer of the HEMT, the gate having a first gate edge portion, a second gate edge portion, and a gate central portion;
    a first dielectric spacer formed on the first gate edge portion;
    a second dielectric spacer formed on the second gate edge portion; and
    a gate electrode formed between the first dielectric spacer and the second dielectric spacer, and in contact with the gate at the gate central portion;
    wherein a first width of the gate electrode from the first dielectric spacer to the second dielectric spacer at a first distance from the gate is less than a second width of the gate electrode from the first dielectric spacer to the second dielectric spacer at a second distance from the gate, with the first distance being less than the second distance.

11. The HEMT of claim 10, wherein the gate electrode has a first width between the first dielectric spacer and the second dielectric spacer at an interface of the gate and the gate electrode, and a second width between the first dielectric spacer and the second dielectric spacer at a distance from the interface, the second width being larger than the first width.

12. The HEMT of claim 11, wherein the first dielectric spacer and the second dielectric spacer have widths therebetween that increase with increasing distance from the gate, including at least a third width that is greater than the first width but less than the second width.

13. The HEMT of claim 10, wherein the gate electrode comprises:
    a first metal layer formed in contact with the gate central portion, the first dielectric spacer, and the second dielectric spacer; and
    a second metal layer formed in contact with the first metal layer, the second metal layer having a lower resistivity than the first metal layer.

14. The HEMT of claim 10, further comprising:
    at least one dielectric layer formed on the barrier layer, adjacent to the second dielectric spacer and to the gate, and between the gate and a source contact of the source; and
    a dielectric foot formed on the barrier layer and extending from the at least one dielectric layer in a direction of the source contact,
    wherein the source contact is formed over the dielectric foot and adjacent to the at least one dielectric layer.

15. The HEMT of claim 10, further comprising:
    a field plate connected to a source contact of the source and extending parallel to the gate between the gate and a drain contact of the drain, at a distance from the first dielectric spacer that is defined by at least one intervening dielectric layer.

16. A High Electron Mobility Transistor (HEMT), comprising:
   a source;
   a drain;
   a channel layer extending between the source and the drain;
   a barrier layer formed in contact with the channel layer, and extending between the source and the drain;
   a p-type gate formed in contact with, and covering at least a portion of, the barrier layer, the gate having a first gate edge portion, a second gate edge portion, and a gate central portion;
   a first dielectric spacer formed over the first gate edge portion;
   a second dielectric spacer formed over the second gate edge portion, with a first width from the first dielectric spacer to the second dielectric spacer at a first distance to the gate, a second width from the first dielectric spacer to the second dielectric spacer at a second distance to the gate, and a third width from the first dielectric spacer to the second dielectric spacer at a third distance from the gate, wherein the third width is greater than the second width and the second width is greater than the first width; and
   a gate electrode formed on the gate central portion and between the first dielectric spacer and the second dielectric spacer.

17. The HEMT of claim 16, wherein the first dielectric spacer and the second dielectric spacer have curved surfaces, to which corresponding curved surfaces of the gate electrode conform.

18. The HEMT of claim 16, wherein the gate electrode comprises:
   a first metal layer formed in contact with the gate central portion, the first dielectric spacer, and the second dielectric spacer; and
   a second metal layer formed in contact with the first metal layer.

19. The HEMT of claim 16, further comprising:
   at least one dielectric layer formed on the barrier layer, adjacent to one of the first dielectric spacer and the second dielectric spacer, and to the gate, and between the gate and a source contact of the source; and
   a dielectric foot formed on the barrier layer and extending from the at least one dielectric layer in a direction of the source contact.

20. The HEMT of claim 16, further comprising:
   a field plate connected to a source contact of the source and extending parallel to the gate, at a distance from the first dielectric spacer that is defined by at least one intervening dielectric layer.

* * * * *